United States Patent [19]

Hong

[11] Patent Number: 5,571,739
[45] Date of Patent: Nov. 5, 1996

[54] METHOD FOR FABRICATING A READ-ONLY-MEMORY (ROM) USING A NEW ROM CODE MASK PROCESS

[75] Inventor: Gary Hong, Hsin-Chu, Taiwan

[73] Assignee: United Microelectronics Corporation, Hsin-Chu, Taiwan

[21] Appl. No.: 497,883

[22] Filed: Jul. 3, 1995

[51] Int. Cl.$^6$ ............................................. H01L 21/8246
[52] U.S. Cl. .................... 437/48; 437/45; 437/239
[58] Field of Search ........................... 437/45, 48, 238, 437/239, 979, 985

[56] References Cited

U.S. PATENT DOCUMENTS

| | | | |
|---|---|---|---|
| 5,117,389 | 5/1992 | Yiu | 365/104 |
| 5,306,657 | 4/1994 | Yang | 437/48 |
| 5,436,185 | 7/1995 | Hsue et al. | 437/48 |
| 5,472,898 | 12/1995 | Hong et al. | 437/45 |

OTHER PUBLICATIONS

"A Selective SiO$_2$ Film–Formation Technology Using Liquid. Phase Deposition for Fully Planarized Mutilevel Interconnections" by T. Homma et al. J Electro Chem Soc. vol. 140, No. 8, Aug. 1993 pp. 2410–2414.

Primary Examiner—Chandra Chaudhari
Attorney, Agent, or Firm—William H. Wright

[57] ABSTRACT

A method of manufacturing an improved Read-Only-Memory (ROM) device, was achieved. The array of programmed ROM cells composed of field effect transistors (FETs) are fabricated having improved bit lines with lower resistance. The method utilizes the selective deposition of silicon oxide by a method of Liquid Phase Deposition (LPD) to form a thick insulating oxide layer over the gate oxide of the FET in the coded memory cells. The thick insulating oxide raises the threshold voltage of the FET, preventing the FET from turning on when a gate voltage is applied. The coding using a thick insulating oxide eliminates the need to code the ROM memory cells by ion implantation, and thereby prevents the counter-doping of the bit lines which results in the high bit line resistivity that degrades circuit performance.

21 Claims, 4 Drawing Sheets

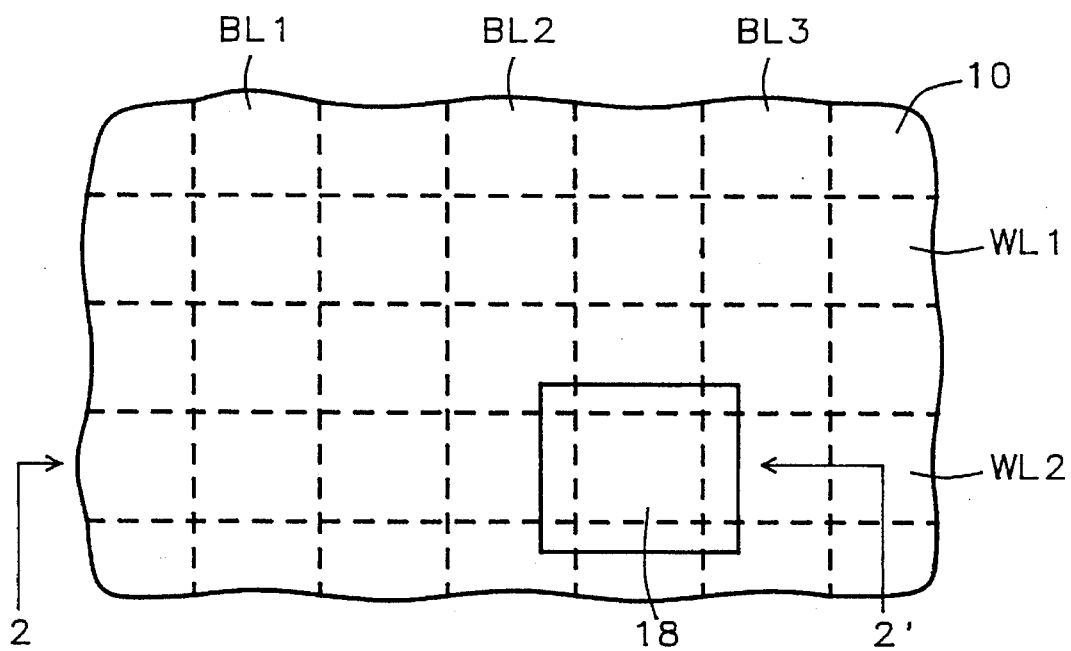
FIG. 1 – Prior Art
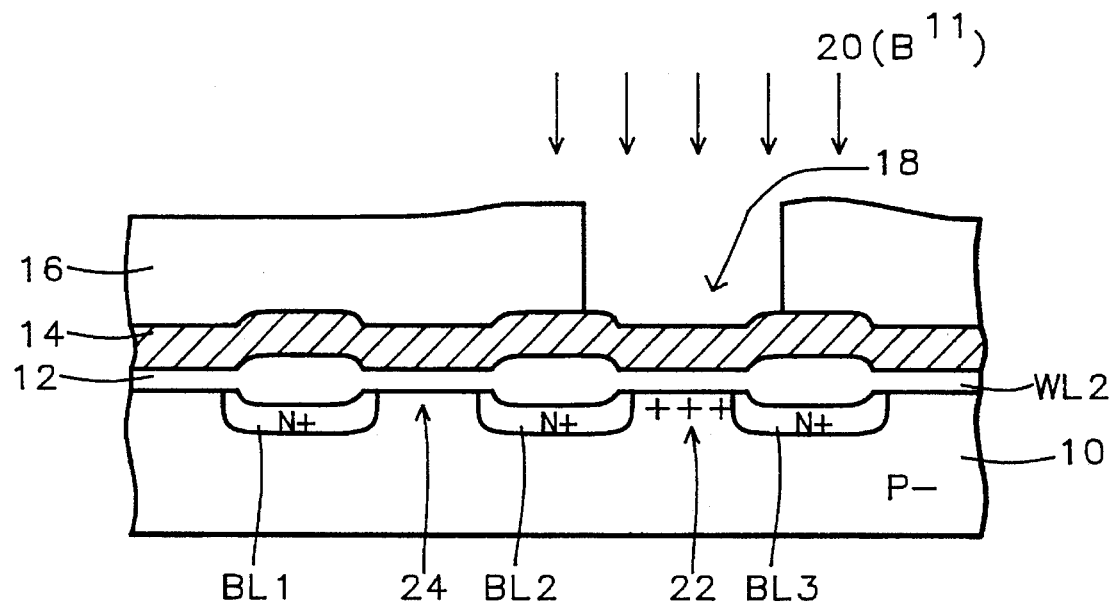
FIG. 2 – Prior Art

METHOD FOR FABRICATING A READ-ONLY-MEMORY (ROM) USING A NEW ROM CODE MASK PROCESS

BACKGROUND OF THE INVENTION

(1) Field of the Invention

The present invention relates to the fabrication of integrated circuit memory devices on semiconductor substrates, and more particularly to an improved Read-Only-Memory (ROM) structure and method of fabrication.

(2) Description of the Prior Art

Read-Only-Memory (ROM) circuits are used to permanently store code in electronic equipment, such as computers, microprocessor systems and the likes. The code or information stored in the ROM circuit is non-volatile, but otherwise is available like the volatile information stored in dynamic random access memory (DRAM) or static random access memory (SRAM). However, the information stored in the ROM, such as micro-instructions for programs, is available the instant the electronic equipment, containing the ROM circuit, is powered up.

The code for the ROM is introduced during semiconductor processing by using a ROM code mask during one of the processing steps. Typically the array of binary code is represented by the presence or absence of a transistor at the memory cell locations. The presence or absence of the transistor can be achieved by designing the ROM code mask for patterning a diffusion, depletion, contacts or metal during ROM device processing. Typically, the patterning and thereby the coding is done at the substrate level to achieve the highest layout density while patterning at the contact and metal level is done to achieve the fastest turn around time to finished product.

Ultra Large Scale Integration (ULSI) on the semiconductor substrate has dramatically increased the device density, improving performance and reducing cost on circuits such as DRAM, SRAM, microprocessors and the likes. These same advances in technology, such as high resolution photolithographic techniques and advances in directional plasma etching, have also resulted in similar increases in cell density on ROM chips.

Although those skilled in the semiconductor industry are well aware of the benefits associated with down scaling the device feature sizes, such as improves circuit density and performance, numerous down-scaling problems do occur that can adversely affect device performance and reliability. One specific problem that occurs on the read-Only Memory (ROM) cell when the cell size is reduced and the array of ROM cells are coded using a conventional ion implantation for coding, is an increase in the electrical resistance of the bit lines with a corresponding decrease in circuit performance.

The nature of this problem is best understood by referring to the prior art that is shown in FIGS. 1 and 2. The typical ROM device consists partially of an array of memory cells, each cell comprised of a single field effect transistor (FET). The array of FETs are fabricated by forming a plurality of parallel, closely spaced conducting lines called "bit lines". They are formed for example by photoresist masking and implantation. The bit lines are formed of heavily doped regions, such as N-type dopants, in a semiconducting substrate 10 having a background or substrate doping of the opposite polarity. For example, doped with boron (B). A top view of the bit lines labelled BL1, BL2 and BL3 are shown in FIG. 1, and a cross section through the section 2—2 of FIG. 1 is shown in FIG. 2. For practical reasons, only a portion of the ROM structure is shown. The bit lines serve as the source/drain areas of the array of FETs. A thin gate oxide 12 between the bit lines and a thicker insulating oxide 14 over the bit lines, as shown in FIG. 2, are then formed on the substrate surface, for example, by thermal oxidation. A plurality of parallel, closely spaced conducting lines, called "word lines" are formed orthogonal to the bit lines over the oxide layer. The word lines are usually formed by depositing and patterning a doped polysilicon layer. Two of the plurality of word lines formed are depicted in FIG. 1 and labelled as WL1 and WL2. The portion of the word lines over the gate oxide function as the gate electrodes of the array of FETs that are now built. The word lines and bit lines are connected by a patterned metallurgy to suitable peripheral circuits (not shown) that allow the array of FETs to be electrically addressed and interrogated.

Selected FETs can now be modified to make them permanently non-conductive, thereby coding the ROM array. A ROM implant code mask composed of photoresist 16, as shown in FIG. 2, is patterned forming ROM code openings over the FET gate areas selected for coding, one opening 18 of which is shown in FIG. 1 and 2. A ROM code implant 20, such as a boron ($B^{11}$) implantation, is carried out so as to program the ROM chip by forming a high concentration doped region 22. This implant increases the FET threshold voltage ($V_t$). to a value greater than the applied gate voltage ($V_g$). When the chip fabrication is complete, and the gate voltage $V_g$ is applied to the word line WL2 over the implanted region 22, via the address circuit, the FET in the code cell does not turn on, and thereby, represent a binary 0. However, in cells that are masked from implantation, such as the adjacent cell in region 24, as shown in FIG. 2, the low P– doped surface is inverted and the FET having a $V_t$ less than the $V_g$ turns on. This provides a conducting path between the source and drain formed from bit lines BL1 and BL2, and thereby, for example, represents a binary 1.

Unfortunately, when the code implantation is performed the transverse straggle from the implant and the thermal cycle to activate the implanted atoms in region 22 result in lateral diffusion of the dopant which causes counter-doping of the adjacent bit lines BL2 and BL3, as shown in FIG. 2. This substantially constricts the width of the buried bit line adjacent to the code implant region 22 and increases substantially the bit line resistance. The problem is further exacerbated if two adjacent memory cells are ROM coded by ion implantation.

As the bit lines are further reduced in width during down scaling, the restriction in the width of the bit lines by ROM code implantation substantially increases the resistance and further degrades circuit performance. One method of reducing this bit line resistance is described by T. D. H. Yiu, in U.S. Pat. No. 5,117,389 in which design changes form subarrays of memory cells that are selected by block select transistors and share a common metal bit line to reduce the bit line resistance. Although the circuit performance is improved, the semiconductor processing is substantially more complex.

Therefore, there is still a strong need in the semiconductor industry to minimize the resistance of the bit line without substantially increasing the process complexity.

SUMMARY OF THE INVENTION

It is the principle object of this invention to provide a method for forming a new ROM circuit structure having reduced bit line resistance.

It is another object of this invention to provide this reduced resistance by selectively forming a thick insulating oxide over the coded cell FETs of the ROM array by a method of Liquid Phase Deposition (LPD).

It is still another object of the invention to form these ROM circuits without increasing the process masking levels, and thereby providing a cost effective ROM product.

In accordance with the objectives of this invention a method is provided for manufacturing an improved ROM semiconductor device in and on a semiconducting substrate. The method begins by providing a semiconductor substrate, such as a P– doped single crystal silicon having a <100> crystallographic orientation.

The array of coded cells for the ROM device are fabricated by first forming an array of parallel buried bit lines having a first direction in a portion of the substrate surface using a patterned photoresist mask and ion implantation. The bit lines being ion implanted with an N+ type dopant, such as arsenic ($As^{75}$) or phosphorus ($p^{31}$) ions. Portions of the bit lines form the source/drain areas of the FETs used in the array of ROM cells. The substrate is then thermally oxidized forming a gate oxide between the bit lines and a somewhat thicker insulating oxide over the buried bit line. A patterned photoresist ROM code mask having openings in selected areas over the gate oxide and between the bit lines are formed. An isolation oxide layer, composed of silicon oxide, is then deposited selectively on the gate oxide in the photoresist openings by the method of Liquid Phase Deposition (LPD). One method of achieving the LPD deposition is by immersing the substrate in a supersaturated solution of hydrofluosilicic acid ($H_2SiF_6$) made supersaturated by dissolving silicon oxide ($SiO_2$) powder therein and maintained in a super-saturated state, during the oxide deposition, by continuously adding boric acid. A more detail description of the method for liquid-phase deposition of $SiO_2$ can be founds in the paper by T. Homma et al, entitled "A Selective $SiO_2$ Film-Formation Technology Using Liquid-Phase Deposition for Fully Planarized Multilevel Interconnections" and published in the Journal of the Electrochemical Society, Vol. 140, No. 8, August 1993.

The photoresist ROM code mask is then removed (stripped) using conventional means leaving a patterned relatively thick isolation oxide, composed of LPD silicon oxide, over portions of the gate oxide within the cells selected for coding. A polysilicon layer, also doped N type, is then deposited on the substrate and patterned by conventional lithographic techniques and plasma etching to form an array of parallel, closely spaced word lines. The array of word lines are formed orthogonal to the buried bit lines and are aligned over the isolation oxide regions. The portions of the word lines over the gate oxide areas form a series of gate electrodes for the single FETs in each of the ROM cells, and thereby completes the formation of the coded array of ROM cells of this invention.

The thick isolation oxide, formed by LPD, over the selected gate oxide areas of the ROM cells provide a very important function of the invention. The thick LPD isolation oxide on the selected FETs increases the threshold voltage ($V_t$) of the FET preventing the FET from turning on (conducting) when a gate voltage $V_g$ is applied to the word line, and thereby can represent, for example, a coded binary zero (0), while in the cells having FET gate oxides without the thick LPD isolation oxide, and therefore having low $V_t$ are allowed to turn on, and thereby, for example, can represent a coded binary one (1). The ROM coding using the LPD isolation oxide, of this invention, instead of the ion implantation eliminates the counter-doping of the bit line which would otherwise increase the bit line resistance and degrade the circuit performance.

BRIEF DESCRIPTION OF THE DRAWINGS

The object and other advantages of this invention are best explained in the preferred embodiment with reference to the accompanying drawings, in which:

FIGS. 1 and 2 show a schematic elevational view and a cross sectional view, respectively, of a portion of the prior art ROM device.

DESCRIPTION OF THE PREFERRED EMBODIMENTS

Although the embodiment of this invention describes in detail only the method of fabricating the improved coded array of memory cells on a ROM integrated circuit device, it should be well understood by those skilled in the art that by including additional processing steps other semiconductor structures can be included on the substrate. For example, a field oxide structure (not shown) for isolating device areas can be formed on the substrate, leaving portions of the substrate surface exposed for fabricating semiconductor devices. For example, the field oxide can be formed by methods commonly used in the semiconductor industry, such as by the Local Oxidation of silicon (LOCOS). The field oxide electrically isolates the device areas wherein FETs, and for the purpose of this invention the array of Read-Only-Memory (ROM) cells are also formed. In addition, N doped wells and P doped wells can also be included on the substrate forming, respectively, therein P-channel and N-channel FETs used to fabricate CMOS circuits, as might be required for forming the address and output decode circuits on the ROM chip.

Figure 3:
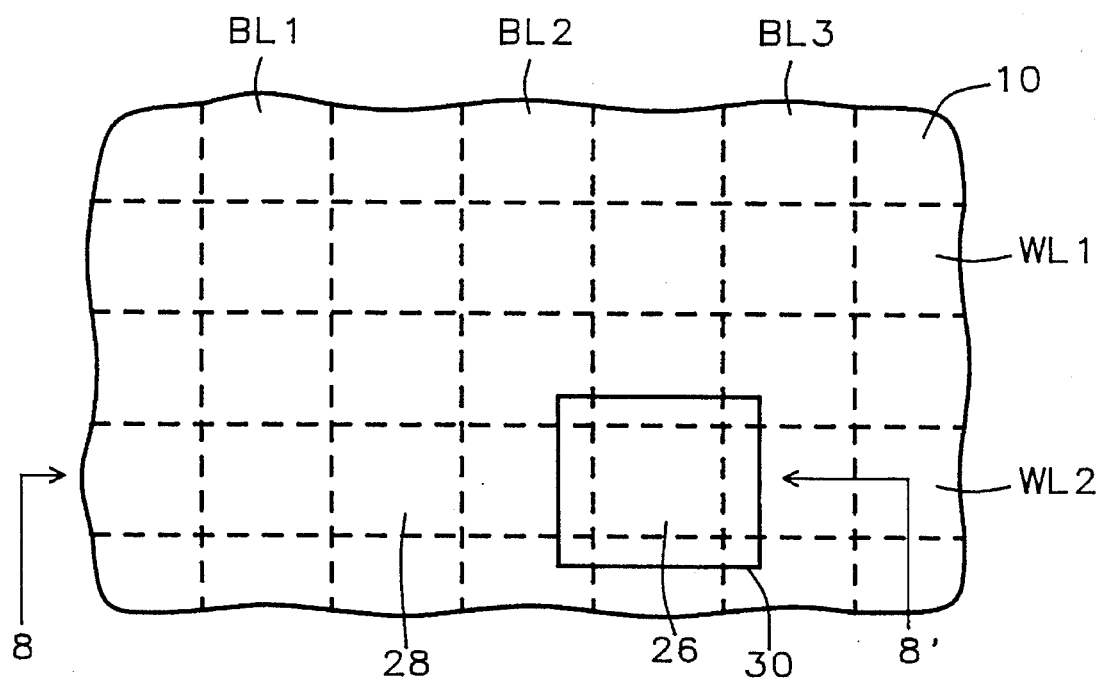
FIG. 3 shows a schematic elevational view of a ROM device in accordance with this invention.
Figure 8:
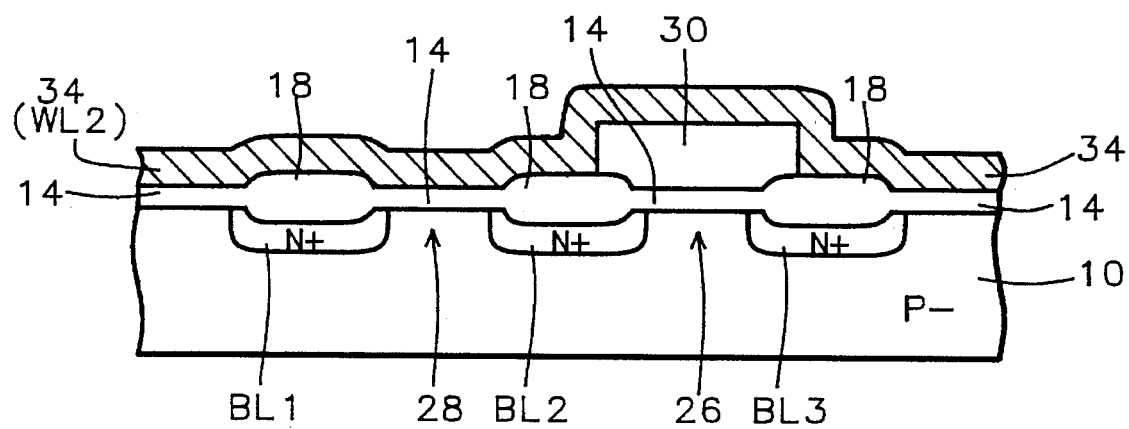

Referring now more particularly to FIG. 3, a schematic elevational view of a portion of the cell array of the ROM, of this invention, is shown after completion of the ROM array. Also a cross sectional view is shown in FIG. 8, of region 8—8 containing word line WL2, as shown in FIG. 3. Three buried bit lines BL1, BL2 and BL3 of the array are shown formed in the substrate 10. Also shown in FIG. 3, in one of the patterned isolation oxide areas 30 for coding one of the ROM cell areas 26. Adjacent to the coded cell area 26 is an uncoded cell area 28 without the thick isolation oxide, as is also shown in FIG. 8.

Figure 4:
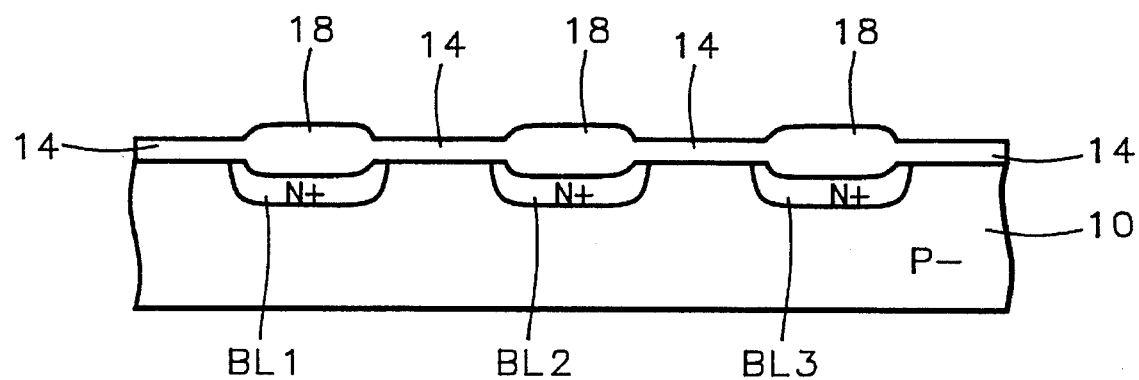
FIGS. 4 through 8 show schematic cross sectional views for the process flow of the ROM device with the improved array of memory cells of this invention.

Referring now more specifically to FIGS. 4 through 8, the details of the new and improved ROM process for manufacturing an array of coded ROM cells is described. The process starts, as shown in FIG. 4, by providing a semiconductor substrate 10. The preferred substrate is typically composed of a P– doped single crystal silicon with a <100> crystallographic orientation and doped with, for example, boron (B). The substrate or background dopant is typically doped having a concentration of between about 1.0 E 14 to 1.0 E 16 atoms/cm³. The array of ROM cells having selected cells coded are then fabricated in and on the silicon substrate 10 having portions of the device area therefor allocated.

still referring to FIG. 4, an array of buried bit lines are first formed in a first direction, three of the plurality of bit lines formed are shown in FIG. 4 labelled as BL1, BL2 and BL3.

The bit lines are formed using conventional lithographic techniques to patterned a photoresist implant mask (not shown in the FIG. 4) leaving open areas for implanting the bit lines. Ion implantation is then used to dope the substrate 10 forming the bit lines, such as BL1, BL2 and BL3. The bit lines are preferably doped N-type with arsenic ($As^{75}$) or phosphorus ($p^{31}$) ions having a preferred dose of between about 1.0 E 15 to 5.0 E 15 ions/cm$^2$ and a implant energy of between about 30 to 100 KeV. After removing the photoresist mask the substrate is thermally annealed to activate the implanted atoms. Typically, after completion of the ROM device processing the metallurgical junction depth ($X_j$) of the bit lines are between about 0.1 to 0.5 micrometers below the substrate surface.

Next as also shown in FIG. 4, a thermal oxide layer is grown on the substrate 10 forming a gate oxide layer 14 between the buried bit lines and a somewhat thicker insulating oxide layer 18 over the buried bit lines. The preferred oxidation is carried out in a dry oxygen ambient at a temperature of between about 800° to 1000° C. The gate oxide layer 14 is grown to a preferred thickness of about 60 to 200 Angstroms. The enhanced oxidation rate of the heavily doped bit lines, as is commonly known in the semiconductor industry, results in a somewhat thicker insulation silicon oxide layer 18 forming on the bit line. For example, the thickness of layer 18 is typically between about 200 to 800 Angstroms for the above thermal oxidation conditions.

Figure 5:
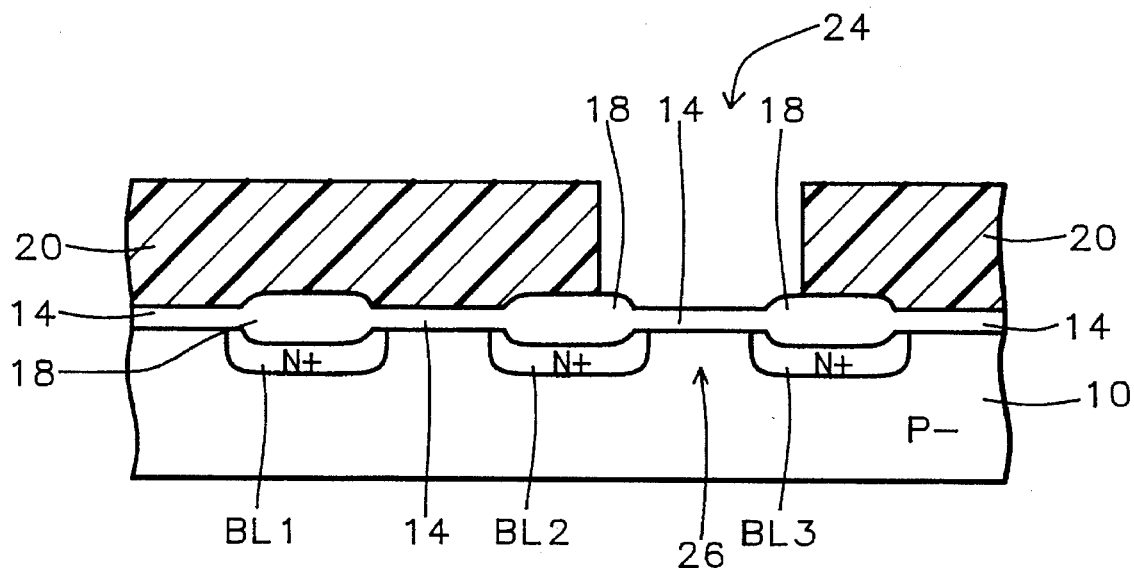

Now as shown in FIG. 5, the ROM code masking step is performed to code (program) the ROM cells. A patterned photoresist code mask 20 is formed by conventional photolithographic techniques having openings over the selected cells for programming or coding. The preferred patterned photoresist mask having openings with essentially vertical sidewalls. One such opening 24 over cell area 26 is depicted in FIG. 5 where, for example, product design requires a coded or programmed cell. Also shown is an adjacent cell area 28 which is covered with photoresist and is therefore protected from being programmed. The photo-resist code mask 20 is preferably between about 1.0 to 2.0 micrometers thick.

Figure 6:
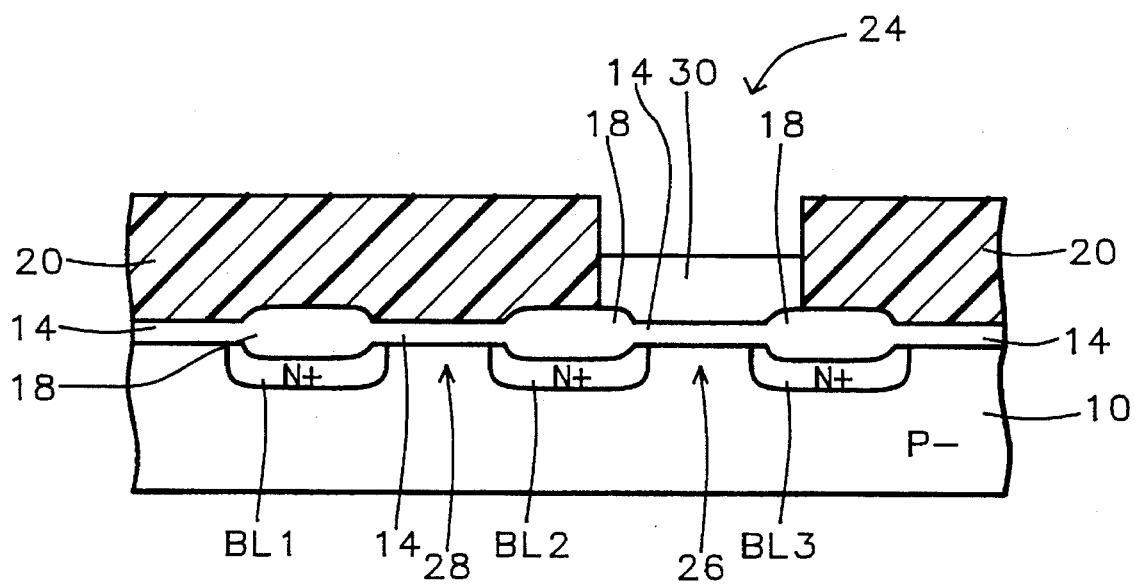

Now as shown in FIG. 6, the opening 24 in the patterned photoresist code mask 20 is selectively filled with an isolation oxide layer 30 forming a thick oxide over the gate oxide 14 in the coded cell area 26, while leaving uncoated the photoresist mask layer 20. The preferred method of selectively depositing the isolation oxide is by Liquid Phase Deposition (LPD). Alternatively, if required, a lightly doped implant, for example using boron (B11) ions, can be performed prior to depositing the isolation oxide 30 using the same photoresist code mask 20.

The deposition of the isolation layer 30 by Liquid Phase Deposition (LPD) is achieved by immersing the substrate in a supersaturated solution of, for example, hydrofluosilicic acid ($H_2SiF_6$) made supersaturated by dissolving silicon oxide ($SiO_2$) powder therein. Although the detail mechanism is not well understood, it is believed that a dehydration reaction occurs at the oxide surface making the adsorption of siloxane (Si—O—Si) oligomers possible, and thereby resulting in the selective deposition of $SiO_2$ on the silicon oxide surfaces while not depositing on the non-oxide surfaces, such as the photoresist code mask 20. The preferred thickness of the liquid phase deposited layer 30 is between about 1000 to 5000 Angstroms.

The LPD silicon oxide isolation layer 30 is deposited by a timed deposition until the desired LPD silicon oxide thickness is achieved. The thickness of the LPD silicon oxide layer 30 is critical to the invention because it must be sufficient thick to increase the threshold voltage ($V_t$) of the FET in the coded cells, to prevent the FETs from turning on (conducting) when a gate voltage ($V_g$) is applied to the word line that is formed over the coded cell. For example, if the gate voltage for the particular ROM device is about 3.0 Volts, then the preferred thickness of the LPD silicon oxide isolation layer 30 should exceed a thickness of about 3000 Angstroms.

Figure 7:
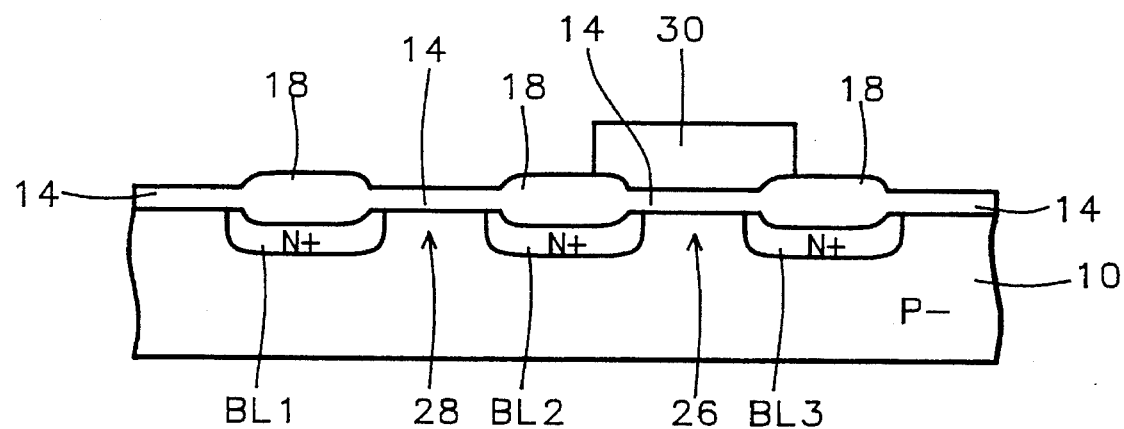

Referring next to FIG. 7, and continuing the process, the photoresist layer 20 is now stripped, for example, by plasma ashing in an oxygen ambient of by conventional photoresist stripping. This results in a thick isolation layer, such as layer 30 in FIG. 7, remaining over the coded cell areas while retaining a thin gate oxide 14 over other gate areas, such as the uncoded cell area 28, as is also indicated in FIG. 7 and FIG. 3.

Referring now to FIG. 8, a polysilicon layer 34 is deposited over the substrate and patterned to form the word lines. The preferred deposition being a Low Pressure Vapor Deposition (LPCVD), for example, using a silane ($SiH_4$) gas, and the preferred thickness is between about 1000 to 4000 Angstroms. The polysilicon layer 34 is then doped with an N type dopant such as phosphorus ($p^{31}$) by ion implantation. Alternatively, the polysilicon layer can be in situ doped during LPCVD. The preferred concentration of the phosphorus dopant in layer 34 is between about 1.0 E 19 to 1.0 E 21 atoms/cm$^3$. The polysilicon layer is then patterned by using conventional photolithographic techniques and anisotropic plasma etching. The etching is performed, for example, in a reactive ion etcher (RIE) using a gas mixture having a high selective etch rate of silicon to silicon oxide. For example, a gas mixture of chlorine ($Cl_2$) and argon (Ar) or a gas mixture containing another chlorinated gas, such as $CCl_2F_2$.

The word lines patterned from polysilicon layer 34 are formed orthogonal to the buried bit lines and are aligned to and extending over the cell areas including the coded cell areas and thereby forming an array of electrode gates for the FETs in the cells. As shown in FIG. 8, for a cross section 8—8 through the word line WL2 of FIG. 3 the word line also extend over the coded cell areas 26 having the patterned isolation layer 30. When a gate voltage $V_g$ is applied to word line WL2, the FET in cell area 28 with the thin gate oxide and the low threshold voltage $V_t$ turns on, forming a conducting path between bit lines BL1 and BL2, and thereby, for example, representing a binary 1, while the cell area 26 which as the thick isolation layer 30 and the high threshold voltage $V_t$ does not turn on, thereby, for example, representing a binary 0.

This completes the method, of this invention for fabricating the array of ROM coded cells with improved bit lines having low resistance. The ROM integrated circuit is now completed (not shown in the FIGS.) by depositing an insulating layer over the substrate and thereby insulating the word lines. For example, a low pressure chemical vapor deposited (LPCVD) silicon oxide as the insulating layer. Alternatively a low flow temperature oxide, such as BPSG can be used to make a more planar structure. Contact openings are then etched in the insulating layer and patterned interconnecting metallurgy, such as aluminium or aluminium alloys, are used to wire-up, that is, to electrically connect the appropriate devices. If necessary, additional insulating layers, contact openings (via holes) and patterned connecting metallurgies process steps can be repeated to complete the ROM integrated circuit.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a Read Only Memory (ROM) device on a semiconductor substrate having an array of memory cells selectively coded, comprising the steps of:

providing a semiconductor substrate having a principle surface with device areas thereon;

forming an array of parallel buried bit lines oriented in a first direction in a portion of said device areas by photoresist masking and ion implantation;

forming a silicon oxide layer on said substrate by thermal oxidation and thereby forming an electrically insulating layer over said buried bit lines and a gate oxide layer between said buried bit lines and on said substrate;

forming a patterned photoresist code mask having opening in selected cell areas between said buried bit lines and over said gate oxide areas wherein said coded memory cells are to be formed;

depositing selectively by Liquid Phase Deposition (LPD) a LPD silicon oxide layer on said exposed gate oxide layer and leaving free from deposition said patterned photoresist code mask layer, thereby forming patterned isolation oxide areas in said coded memory cell areas;

removing said patterned photoresist mask layer;

depositing a polysilicon layer;

patterning said polysilicon layer by photoresist masking and etching, and thereby forming an array of parallel word lines oriented in a second direction orthogonal to said buried bit lines and aligned over said patterned isolation oxide areas and thereby completing said array of memory cells having select cells coded on said read-only-memory (ROM) device.

2. The method of claim 1, wherein said buried bit lines are formed by ion implantation of an N-type dopant having a implant dose of between about $1.0\ E\ 15$ to $5.0\ E\ 15$ ions/cm$^2$ and an implant energy of between about 30 to 100 KeV.

3. The method of claim 1, wherein said silicon oxide layer on said buried bit lines is formed by thermal oxidation having a thickness of between about 200 to 800 Angstroms.

4. The method of claim 3, wherein said silicon oxide layer formed simultaneously between said buried bit lines is between about 60 to 200 Angstroms thick.

5. The method of claim 1, wherein said photoresist code mask has a thickness of between about 1.0 to 1.5 micrometers.

6. The method of claim 1, wherein the thickness of said selectively deposited silicon oxide layer by liquid phase deposition (LPD) is between about 1000 to 5000 Angstroms.

7. The method of claim 1, wherein said liquid phase deposition is performed in a supersaturated aqueous solution of hydrofluorsilicic acid ($H_2SiF_6$) and boric acid ($H_3BO_3$) acid at a temperature of about 35° C.

8. The method of claim 7, wherein said aqueous solution of boric acid is added continuously to said hydrofluorsilicic acid ($H_2SiF_6$) to maintain a supersaturated solution.

9. The method of claim 1, wherein said polysilicon layer is doped with N-type dopant having a concentration of between about $1.0\ E\ 19$ to $1.0\ E\ 21$ atoms/cm$^3$.

10. The method of claim 9, wherein the thickness of said polysilicon layer is between about 1000 to 4000 Angstroms.

11. The method of claim 1, wherein said patterned insulating layer is formed in select memory cells to prevent field effect transistors from turning on when a voltage is applied to said word lines, and thereby representing a binary zero.

12. A method for fabricating a Read Only Memory (ROM) device on a semiconductor substrate having coded memory cell, comprising the steps of:

providing a semiconductor substrate having a principle surface with device areas thereon;

forming an array of parallel buried bit lines oriented in a first direction in portion of said device areas by photoresist masking and ion implantation;

forming a silicon oxide layer on said substrate by thermal oxidation and thereby forming an electrically insulating layer over said buried bit lines and a gate oxide between said buried bit lines;

forming a patterned photoresist code mask having opening in select areas between said bit lines and exposing said gate oxide areas, wherein said coded memory cells are formed;

depositing selectively by liquid phase deposition (LPD), in a solution of hydrofluorsilicic acid and boric acid, a LPD silicon oxide layer on said exposed gate oxide areas and leaving free from LPD silicon oxide deposit said patterned photoresist code mask layer;

removing said patterned photoresist code mask layer;

depositing a polysilicon layer;

patterning said polysilicon layer by photoresist masking and etching, and thereby forming an array of parallel word lines perpendicular to said buried bit lines and aligned over said patterned isolation oxide areas and thereby completing said array of memory cells having select memory cells coded on said read-only-memory device.

13. The method of claim 12, wherein said buried bit lines are formed by ion implantation of an N-type dopant having a implant dose of between about $1.0\ E\ 15$ to $5.0\ E\ 15$ ions/cm$^2$ and an implant energy of between about 30 to 100 KeV.

14. The method of claim 12, wherein said silicon oxide layer on said buried bit lines is formed by thermal oxidation having a thickness of between about 200 to 800 Angstroms.

15. The method of claim 14, wherein said silicon oxide layer formed simultaneously between said buried bit lines is between about 60 to 200 Angstroms thick.

16. The method of claim 12, wherein said photoresist code mask layer has a thickness of between about 1.0 to 1.5 micrometers.

17. The method of claim 12, wherein the thickness of said selectively deposited silicon oxide layer by liquid phase deposition (LPD) is between about 1000 to 5000 Angstroms.

18. The method of claim 12, wherein said aqueous solution of boric acid is added continuously to said hydrofluorsilicic acid ($H_2SiF_6$) to maintain a super-saturated solution.

19. The method of claim 12, wherein said polysilicon layer is doped with N-type dopant atoms having a concentration of between about $1.0\ E\ 19$ to $1.0\ E\ 21$ atoms/cm$^3$.

20. The method of claim 19, wherein the thickness of said polysilicon layer is between about 1000 to 4000 Angstroms.

21. The method of claim 12, wherein said patterned insulating layer is formed in select memory cells to prevent field effect transistors from turning on when a voltage is applied to said word lines, and thereby representing a binary zero.

* * * * *